(12) United States Patent
Kohiki et al.

(10) Patent No.: US 9,028,972 B2
(45) Date of Patent: May 12, 2015

(54) COPPER FOIL FOR PRINTED WIRING BOARD, METHOD FOR PRODUCING SAID COPPER FOIL, RESIN SUBSTRATE FOR PRINTED WIRING BOARD AND PRINTED WIRING BOARD

(75) Inventors: Michiya Kohiki, Ibaraki (JP); Terumasa Moriyama, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 13/825,889

(22) PCT Filed: Sep. 8, 2011

(86) PCT No.: PCT/JP2011/070448
§ 371 (c)(1),
(2), (4) Date: Apr. 29, 2013

(87) PCT Pub. No.: WO2012/043182
PCT Pub. Date: Apr. 5, 2012

(65) Prior Publication Data
US 2013/0220685 A1    Aug. 29, 2013

(30) Foreign Application Priority Data

Sep. 27, 2010  (JP) .................................. 2010-214724

(51) Int. Cl.
*B32B 15/20* (2006.01)
*H05K 3/02* (2006.01)
(Continued)

(52) U.S. Cl.
CPC .......... *H05K 3/022* (2013.01); *Y10T 428/12549* (2015.01); *Y10T 428/24355* (2015.01);
(Continued)

(58) Field of Classification Search
CPC ................................ A01B 12/006; C25D 5/16

USPC .......... 428/629, 628, 632, 640, 675–680, 553, 428/607, 612, 687, 935; 205/111
See application file for complete search history.

(56) References Cited

U.S. PATENT DOCUMENTS

| 3,585,010 | A | 6/1971 | Luce et al. |
| 5,366,814 | A | 11/1994 | Yamanishi et al. |

(Continued)

FOREIGN PATENT DOCUMENTS

| JP | 03-122298 A | 5/1991 |
| JP | 06-310835 A | 11/1994 |

(Continued)

*Primary Examiner* — Cathy Lam
(74) *Attorney, Agent, or Firm* — Howson & Howson LLP (57) ABSTRACT

A copper foil for a printed wiring board, the copper foil being characterized by having, on at least one surface thereof, a roughed layer of the copper foil in which an average diameter at a particle root (D1) corresponding to a distance of 10% of a particle length from the root, is 0.2 μm to 1.0 μm, and a ratio of the particle length (L1) to the average diameter at the particle root (D1) is 15 or less when L1/D1. A copper foil for a printed wiring board, wherein a sum of area covered by holes on an uneven and roughened surface of a resin is 20% or more at a surface of the resin formed by laminating the resin and a copper foil for a printed wiring having a roughened layer and then removing the copper layer by etching. An object of the present invention is to develop a copper foil for a semiconductor package board in which the aforementioned phenomenon of circuit erosion is avoided without deteriorating other properties of the copper foil. In particular, an object of the present invention is to provide a copper foil for a printed wiring board and a producing method thereof, wherein a roughened layer of the copper foil can be improved to enhance the adhesiveness between the copper foil and a resin.

13 Claims, 1 Drawing Sheet

Surface roughness of base foil: Rz2.0μm or less

D1 Particle root: at a distance of 10% of the particle length

D2 Particle middle: at a distance of 50% of the particle length

D3 Particle tip : at a distance of 90% of the particle length (51) Int. Cl.
  *H05K 3/38* (2006.01)
  *H05K 1/09* (2006.01)
  *H05K 3/06* (2006.01)
  *C25D 1/04* (2006.01)
  *C25D 3/38* (2006.01)
  *C25D 5/10* (2006.01)
  *C25D 5/12* (2006.01)
  *C25D 5/16* (2006.01)
  *C25D 7/06* (2006.01)
  *C25D 11/38* (2006.01)
  *C23C 18/16* (2006.01)

(52) U.S. Cl.
  CPC ........... *Y10T428/12431* (2015.01); *H05K 3/38* (2013.01); *H05K 1/09* (2013.01); *H05K 3/06* (2013.01); *C25D 1/04* (2013.01); *C25D 3/38* (2013.01); *C25D 5/10* (2013.01); *C25D 5/12* (2013.01); *C25D 5/16* (2013.01); *C25D 7/0614* (2013.01); *C25D 11/38* (2013.01); *C23C 18/1651* (2013.01); *Y10S 428/935* (2013.01)

(56) References Cited

U.S. PATENT DOCUMENTS

| | | | |
|---|---|---|---|
| 5,800,930 | A | 9/1998 | Chen et al. |
| 6,346,335 | B1 * | 2/2002 | Chen et al. .................... 428/629 |
| 6,562,222 | B1 | 5/2003 | Sekiguchi et al. |
| 6,579,437 | B2 | 6/2003 | Mitsuhashi et al. |
| 6,638,642 | B2 | 10/2003 | Kitano et al. |
| 6,835,241 | B2 | 12/2004 | Tsuchida et al. |
| 6,989,199 | B2 * | 1/2006 | Yamamoto et al. ........... 428/607 |
| 7,341,796 | B2 | 3/2008 | Hanafusa |
| 7,381,475 | B2 | 6/2008 | Suzuki |
| 8,142,905 | B2 | 3/2012 | Moriyama et al. |
| 8,252,166 | B2 | 8/2012 | Kobayahsi et al. |
| 2002/0182432 | A1 | 12/2002 | Sukamoto et al. |
| 2004/0209109 | A1 | 10/2004 | Tsuchida et al. |
| 2009/0162685 | A1 | 6/2009 | Kobayashi et al. |
| 2009/0208762 | A1 | 8/2009 | Akase |
| 2011/0127074 | A1 | 6/2011 | Takahashi |
| 2011/0127707 | A1 | 6/2011 | Honda et al. |
| 2011/0262764 | A1 | 10/2011 | Arai et al. |
| 2012/0107637 | A1 | 5/2012 | Akase |
| 2012/0135266 | A1 | 5/2012 | Kaminaga |
| 2012/0148862 | A1 | 6/2012 | Moriyama et al. |
| 2012/0276412 | A1 | 11/2012 | Miki |
| 2013/0011690 | A1 | 1/2013 | Arai et al. |
| 2013/0011734 | A1 | 1/2013 | Arai et al. |
| 2014/0037976 | A1 | 2/2014 | Arai et al. |
| 2014/0057123 | A1 | 2/2014 | Arai et al. |
| 2014/0093743 | A1 | 4/2014 | Arai et al. |

FOREIGN PATENT DOCUMENTS

| | | |
|---|---|---|
| JP | 07-321456 A | 12/1995 |
| JP | 08-236930 A | 9/1996 |
| JP | 2002-069691 A | 3/2002 |
| JP | 2002-170827 A | 6/2002 |
| JP | 2005-008955 A | 1/2005 |
| JP | 2009-215604 A | 9/2009 |
| JP | 2010-037585 A | 2/2010 |
| WO | 2010-093009 A1 | 8/2010 |
| WO | 2010/110092 A1 | 9/2010 |

* cited by examiner

Fig. 1

Surface roughness of base foil: Rz2.0µm or less

D1 Particle root: at a distance of 10% of the particle length

D2 Particle middle: at a distance of 50% of the particle length

D3 Particle tip: at a distance of 90% of the particle length

COPPER FOIL FOR PRINTED WIRING BOARD, METHOD FOR PRODUCING SAID COPPER FOIL, RESIN SUBSTRATE FOR PRINTED WIRING BOARD AND PRINTED WIRING BOARD

BACKGROUND

The present invention relates to a copper foil for a printed wiring board having excellent chemical resistance and adhesiveness, a producing method thereof, a resin substrate for a printed wiring board and a printed wiring board. In particular, the present invention provides a copper foil and a producing method thereof as well as a printed wiring board, wherein strong peel strength against chemical treatment when forming a fine pattern on a package board such as a BT (bismaleimide triazine) resin impregnated substrate can be obtained to allow fine etching. Further, the present invention provides a copper foil for a printed wiring board, a producing method thereof, a resin substrate for a printed wiring board and a printed wiring board, wherein peel strength can be improved significantly in a method of forming a copper pattern by non-electrolytic plating after complete etching of a surface of the copper foil.

A copper foil for a semiconductor package board, which is also called a copper foil for a printed wiring board in general, is usually fabricated by the following steps. First, a copper foil is laminate-bonded to a substrate such as a synthetic resin under high temperature and high pressure. Subsequently, in order to form a conductive circuit of interest on the substrate, a circuit equivalent to that circuit is printed on the copper foil using a material such as an etching resistant resin.

Then an unwanted and exposed region of the copper foil is removed by etching treatment. After etching, the printed region of the material such as resin is removed to form a conductive circuit on the substrate. Finally, a predetermined element is soldered to the conductive circuit formed to make various printed circuit boards for electronics devices. Eventually, it is bonded to a resist or a build-up resin substrate. In general, quality requirements for a copper foil for a printed wiring board are different between an adhesive surface to be bonded to a resin substrate (a so-called roughened surface) and a non-adhesive surface (so-called a glossy surface), both of which are required to be satisfied at the same time.

Requirements for a glossy surface include: (1) good appearance and no oxidative discoloration during storage; (2) good solder wettability; (3) no oxidative discoloration upon high temperature heating; (4) good adherence with a resist. On the other hand, requirements for a roughened surface mainly include: (1) no oxidative discoloration during storage; (2) sufficient peel strength maintained after high temperature heating, wet processing, soldering, chemical treatment and the like; (3) no so-called lamination staining generated after lamination with a substrate and etching.

In addition, a low profiled copper foil is increasingly demanded as a pattern becomes finer in recent years. Thus, increased peel strength is needed for a roughened surface of a copper foil.

Further, electronic devices such as personal computers and mobile communications require a printed wiring board and a copper foil which can handle electric signals of increasingly higher frequency according to increased speed and capacity of communications. When a frequency of an electric signal is 1 GHz or higher, the skin effect, in which an electric current flows only on the surface of a conductor, becomes significant, and an uneven surface causes a change in electric current transmission paths, resulting in a non-negligible increase in impedance. In view of this, reduced surface roughness of a copper foil is also desirable. In order to meet these demands, a large number of methods for treating a copper foil for a printed wiring board have been proposed.

In the methods for treating a copper foil for a printed wiring board, in general, a rolled copper foil or an electrolytic copper foil is used; and first, roughening treatment is performed where particles generally comprising copper and copper oxide are attached to the surface of the copper foil in order to increase adhesiveness (peel strength) between the copper foil and a resin. Subsequently, in order to give properties of heat resistance and rust proofing, a heat resistant layer, in another word, 'a barrier layer' such as brass or zinc is formed. Rust proof treatment such as immersion or electrolytic chromate treatment or electrolytic chromium and zinc treatment is performed thereon for prevention of surface oxidation and so on during transportation or storage. Thus, a product is obtained.

Among these, the roughened layer particularly plays a significant role on increasing the adhesiveness (peel strength) between the copper foil and the resin. Conventionally, roundish or spherical projections have been thought to be good for this roughening treatment. The roundish projections are to be achieved by suppressing a growth of dendrites. However, the roundish projections are detached at the time of etching, causing a phenomenon called "powder fall." This phenomenon is not surprising because the contact area between a spherical projection and a copper foil is much smaller compared to the diameter of the roundish or spherical projection.

In order to avoid this phenomenon of "powder fall," a thin copper plating layer is forming over the projections after the above-mentioned roughening treatment to prevent the detachment of the projections (see Patent Literature 1). Although this has an effect of preventing "powder fall," a problem is that the number of steps is increased, and that the effects of preventing "powder fall" vary because the copper plating is thin.

In addition, a technology is known in which a needle-like nodular coating layer comprising an alloy of copper and nickel is formed on a copper foil (Patent Literature 2). Since the nodular coating layer is needle-like, the adhesiveness with a resin is thought to be increased compared to the roundish or spherical projection disclosed in Patent Literature 1. On the other hand, the layer, which is made of a copper-nickel alloy, has different components from the underlying copper foil, and has a different etching speed when a copper circuit is formed by etching. Therefore, there exists a problem that it is unsuitable for a stable circuitry design.

When forming a copper foil for a printed wiring board, a heat resistant and rust proof layer is generally formed. A large number of copper foils over which a coating layer is formed such as Zn, Cu—Ni, Cu—Co and Cu—Zn as examples of metals or alloys to form a heat resistant layer are in practical use (for example, see Patent Literature 3).

Among these, a copper foil over which a heat resistant layer of Cu—Zn (brass) is formed is widely used in industry because it shows no stain in a resin layer when layered over a printed circuit board of an epoxy resin and the like, and because it has excellent properties such as less deteriorated peel strength after high temperature heating.

A method of forming this heat resistant layer of brass is described in detail in Patent Literature 4 and Patent Literature 5.

A copper foil over which such a heat resistant layer of brass is formed is then subject to etching treatment to form a printed circuit. Recently, a hydrochloric acid based etching solution is becoming more popular for use in forming a printed circuit.

However, when a printed circuit board over which a heat resistant layer of brass is formed was subject to etching treatment with a hydrochloric acid based etching solution (for example, $CuCl_2$, $FeCl_3$), and an unwanted region of the copper foil except for a region of the printing circuit was removed to form a conductive circuit, a phenomenon of so-called erosion (circuit erosion) occurred at the both ends of the circuit pattern, causing a problem that the peel strength with the resin substrate was deteriorated.

The phenomenon of circuit erosion is referred to as a phenomenon where erosion occurs by the aforementioned etching solution at the adhesion interface layer between a copper foil of a circuit formed by the aforementioned etching treatment and a resin substrate, i.e. at the side of etching where the heat resistant and rust proof layer of brass is exposed, and the both ends, which are otherwise normally yellow (because it is made of brass), become red due to the erosion because water washing is insufficient, resulting in significantly deteriorated peel strength in those regions. Thus, if this phenomenon occurs over an entire circuit pattern, the circuit pattern will be detached from the substrate, causing a problem.

In view of these, an attempt has been proposed where after performing roughening treatment, rust proof treatment with zinc or a zinc alloy and chromate treatment on a surface of a copper foil, a silane coupling agent containing a small amount of chromium ions is allowed to be adsorbed in the surface after the chromate treatment to improve its resistance to hydrochloric acid (see Patent Literature 7).

Patent Literature 1: Japanese Patent Laid-Open Publication No. H08-236930
Patent Literature 2: Japanese Patent No. 3459964
Patent Literature 3: Japanese Examined Patent Publication No. S51-35711
Patent Literature 4: Japanese Examined Patent Publication No. S54-6701
Patent Literature 5: Japanese Patent No. 3306404
Patent Literature 6: Japanese Patent Application No, 2002-170827
Patent Literature 7: Japanese Patent Laid-Open No. H03-122298

SUMMARY OF INVENTION

Technical Problem

An object of the present invention is to develop a copper foil for a semiconductor package board wherein the above-mentioned phenomenon of circuit erosion is avoided without deteriorating other properties of the copper foil. In particular, an object of the present invention is to provide a copper foil for a printed wiring board, a producing method thereof, a resin substrate for a printed wiring board and a printed wiring board, wherein roughening treatment and process of the copper foil are improved to increase the adhesiveness between the copper foil and the resin.

Solution to Problem

In order to achieve the above objects, as a result of intensive studies, the present inventors provides the following copper foils for a printed wiring board and producing methods thereof:

1) A copper foil for a printed wiring board having a roughened layer of the copper foil, wherein on at least one surface of the copper foil, an average diameter at a particle root (D1) corresponding to a distance of 10% of a particle length is 0.2 μm to 1.0 μm, and the ratio of the particle length (L1) to the average diameter at the particle root (D1) is 15 or less when L1/D1.

2) The copper foil for a printed wiring board according to 1), wherein on at least one surface of the copper foil, the ratio of an average diameter, at a particle middle (D2) corresponding to a distance of 50% of a particle length to the average diameter at the particle root (D1) is 1 to 4 when D2/D1.

3) The copper foil for a printed wiring board according to 2), wherein the ratio of the average diameter at the particle middle (D2) corresponding to a distance of 90% of a particle length to the particle tip (D3) is 0.8 to 1.0 when D2/D3.

4) The copper foil for a printed wiring board according to 2) or 3), wherein the average diameter at the particle middle (D2) is 0.7 to 1.5 μm.

5) The copper foil for a printed wiring board according to 3) or 4), wherein the average diameter at the particle tip (D3) is 0.7 to 1.5 μm.

6) The copper foil for a printed wiring board according to any one of 1) to 5), comprising a heat resistant and rust proof layer containing at least one or more elements selected from zinc, nickel, copper and phosphorus on the roughened layer, a chromate coating layer on the heat resistant and rust proof layer and a layer of a silane coupling agent on the chromate coating layer.

7) A method of producing a copper foil for a printed wiring board, the method comprising: forming the roughened layer according to any one of 1) to 6) using an electrolytic bath of sulfuric acid and copper sulfate, the electrolytic bath containing at least one or more of the substances selected from sulfuric acid alkyl ester salts, tungsten ions and arsenic ions.

8) A method of producing the copper foil for a printed wiring board according to 7), the method comprising: forming a heat resistant and rust proof layer containing at least one or more elements selected from zinc, nickel, copper and phosphorus on the roughened layer, then forming a chromate coating layer on the heat resistant and rust proof layer, and further forming a layer of a silane coupling agent on the chromate coating layer.

9) A copper foil for a printed wiring board, wherein at a surface of a resin formed by laminating a resin layer on a copper foil for a printed wiring board having a roughened layer and then removing the copper layer by etching, a sum of area covered by holes on an uneven roughened surface of the resin is 20% or more.

10) A resin substrate for a printed wiring board, wherein at a resin formed by laminating a resin layer on the copper foil for a printed wiring board having a roughened layer according to any one of 1) to 8) and then removing the copper layer by etching, a sum of area covered by holes on an uneven surface of the resin to which the roughened layer of the copper foil is transferred is 20% or more.

11) A printed wiring board, wherein at a surface of a resin formed by laminating a resin layer on a copper foil for a printed wiring board having a roughened layer and then removing the copper layer by etching, non-electrolytic copper plating and electrolytic plating are performed in this order to form a copper layer, and etching is further performed to form a circuit.

12) A printed wiring board, wherein at a surface of a resin formed by laminating a resin layer on the copper foil for a printed wiring board having a roughened layer according to any one of 1) to 8) and then removing the copper layer by etching, non-electrolytic copper plating and electrolytic plating are performed in this order to form a copper layer, and etching is further performed to form a circuit.

13) The printed wiring board according to 11) or 12), wherein five or more needle-like particles are present in a circuit width of 10 μm.

As described above, the copper foil for a printed wiring board of the present invention forms a needle-like or rod-like fine roughening particle on at least one surface of the copper foil instead of a roundish or spherical projection which has been conventionally thought to be good for roughening treatment.

The present invention has advantageous effects. Namely, the copper foil can provide a printed wiring board wherein the adhesiveness with a resin can be enhanced, and peel strength against chemical treatment at the time of forming a fine pattern on a package board can be increased to allow fine etching. The copper foil is also useful for a method of increasing adhesion strength with a copper layer for a circuit (e.g. a non-electrolytic plating layer) subsequently formed on a surface of a resin by once removing a copper layer completely to transfer a roughened surface to the resin.

In the context of an increasingly finer pattern and increasingly higher frequency for a printed circuit in recent years, it is particularly effective for a semiconductor package board produced by combining a copper foil for a printed circuit (a copper foil for a semiconductor package board) and a copper foil for a semiconductor package board with a resin for a semiconductor package.

DETAILED DESCRIPTION OF INVENTION

Below, the present invention will be described specifically and in detail to facilitate understanding of the present invention. The copper foil used in the present invention may be an electrolytic copper foil or a rolled copper foil.

As described above, the copper foil for a printed wiring board of the present invention forms a needle-like or rod-like fine particle on at least one surface of the copper foil instead of a roundish or spherical projection which has been conventionally thought to be good for roughening treatment.

The roughened layer of a copper foil has a particle in a shape where an average diameter at a particle root (D1) is 0.2 μm to 1.0 μm, and the ratio of the particle length (L1) to the average diameter at the particle root (D1) is 15 or less when L1/D1, provided a particle root (D1) corresponds to a distance of 10% of a particle length from the root. A more preferred shape has, on at least one surface the copper foil, the ratio of an average diameter at a particle middle (D2) to the average diameter at the particle root (D1) is 1 to 4 when D2/D1, provided the particle middle (D2) corresponds to a distance of 50% of a particle length. Further, a preferred shape has the ratio of the average diameter at the particle middle (D2) to the particle tip (D3) may be 0.8 to 1.0 when D2/D3, provided a particle tip (D3) corresponds to a distance of 90% of a particle length from the root. In this case, it is preferred that the average diameter at the particle middle (D2) is 0.7 to 1.5 μm and the average diameter at the particle tip (D3) is 0.7 to 1.5 μm.

Figure 1:
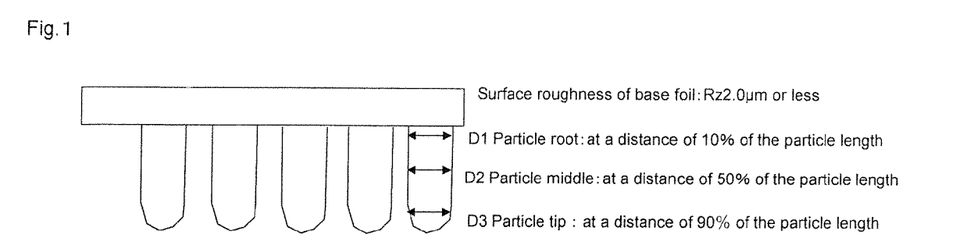
FIG. 1 shows a schematic drawing of particle dimensions.

FIG. 1 shows a schematic drawing of particle dimensions. FIG. 1 shows an average diameter at a particle root (D1) corresponding to a distance of 10% of a particle length from the root; an average diameter (D2) of a particle middle corresponding to a distance of 50% of a particle length; and an average diameter at a particle tip (D3) corresponding to a distance of 90% of a particle length. These can specify a shape of a particle.

Further, a heat resistant and rust proof layer containing at least one or more elements selected from zinc, nickel, copper and phosphorus can be formed on the roughened layer, and a chromate coating layer can be formed on the heat resistant and rust proof layer, and a layer of a silane coupling agent can be formed on the chromate coating layer.

These roughened layers of a copper foil can be formed using an electrolytic bath of sulfuric acid and copper sulfate containing at least one or more of the substances selected from sulfuric acid alkyl ester salts, tungsten ions and arsenic ions. The shape as described above can be obtained by using appropriate conditions for the electrolytic treatment. Further, a heat resistant and rust proof layer containing at least one or more elements selected from zinc, nickel, copper and phosphorus can be formed on the roughened layer, and then a chromate coating layer can be formed on the heat resistant and rust proof layer, and a layer of a silane coupling agent can be further formed on the chromate coating layer.

The copper foil having the roughened layer and a resin can be made into a layered product by the pressing method or the lamination method.

Furthermore, when a resin is laminated on a copper foil having a roughened layer as described above and the copper layer is then removed by etching, the unevenness of the roughened surface of the copper foil is transferred to the resin from which the copper layer is removed. This transferred unevenness on the resin reflects the shape and the number of the roughening particles on the surface of the copper foil, which are important. When the root of a particle on the rough surface of the copper foil is narrow, the diameter of a hole is small and the sum of area covered by holes on the resin surface is small.

In the case that the root of a particle on the rough surface of the copper foil is narrow, i.e. a so-called reversed teardrop-shaped particle, the adhesiveness between the copper foil and a resin is incorrectly thought to increase at first glance. However, because the width for adherence is narrow between the copper layer and the roughening particles, the roughening particles are easily cleaved at its root upon peeling the resin layer off the copper foil, and detached at the interface between the copper foil and the roughening particles or at the roots of the roughening particles where the roughening particles are cleaved, resulting in decreased adherence. A sum of area covered by holes on the resin surface is required to be 20% or more.

Furthermore, in the case that the root of a particle on the rough surface of the copper foil is narrow, a hole on the resin from which the copper layer is removed by etching will have an octopus pot-like shape. Because the hole on the surface is small, even when the surface of the resin is subjected to non-electrolytic plating, a non-electrolytic plating solution cannot enter therein, resulting in incomplete plating. Naturally, a problem will occur where the peel strength of plating is decreased.

As described above, a certain level of a diameter and a length are required for a rough surface of a copper foil, and a sum of area covered by holes on a surface of a resin having the unevenness to which a roughened surface of that copper foil is transferred is important. Making the sum of the area to be 20% or more can increase the peel strength of a circuit.

As described above, a printed wiring board can be obtained wherein at a surface of a resin formed by laminating a resin layer on a copper foil having a roughened layer and then removing the copper layer by etching, non-electrolytic copper plating and electrolytic copper plating are performed in this order, and a circuit is further formed by etching. A layer of non-electrolytic plating and electrolytic plating (a copper layer) is formed over the unevenness on the rough surface of the resin substrate. Needle-like particles or rod-like particles are formed, reflecting the unevenness on the resin surface.

Five or more needle-like particles or rod-like particles are preferably present in a circuit width of 10 μm, and thereby the adhesiveness between the resin and the circuit layer by non-electrolytic plating can be significantly improved. The present invention provides a printed wiring board formed in this way.

As described above, a roughened layer comprising fine needle-like or rod-like roughening particles of copper can be fabricated using an electrolytic bath of sulfuric acid and copper sulfate containing at least one or more of the substances selected from sulfuric acid alkyl ester salts, tungsten ions and arsenic ions.

Preferably, cover plating is performed on the roughened layer comprising fine needle-like roughening particles of copper using an electrolytic bath of sulfuric acid and copper sulfate to prevent powder fall and to improve peel strength.
Specific treatment conditions are as follows:
(Liquid Composition 1)
  $CuSO_4 \cdot 5H_2O$: 39.3 to 118 g/L
  Cu: 10 to 30 g/L
  $H_2SO_4$: 10 to 150 g/L
  $Na_2WO_4 \cdot 2H_2O$: 0 to 90 mg/L
  W: 0 to 50 mg/L
  Sodium dodecyl sulfate: 0 to 50 mg
  $H_3AsO_3$ (a 60% aqueous solution): 0 to 6315 mg/L
  As: 0 to 2000 mg/L
(Electroplating Condition 1)
  Temperature: 30 to 70° C.
(Electric Current Condition 1)
  Current density: 25 to 110 A/dm$^2$
  The amount of coulomb for roughening: 50 to 500 As/dm$^2$
  Plating time: 0.5 to 20 seconds
(Liquid Composition 2)
  $CuSO_4 \cdot 5H_2O$: 78 to 314 g/L
  Cu: 20 to 80 g/L
  $H_2SO_4$: 50 to 200 g/L
(Electroplating Condition 2)
  Temperature: 30 to 70° C.
(Electric Current Condition 2)
  Current density: 5 to 50 A/dm$^2$
  The amount of coulomb for roughening: 50 to 300 As/dm$^2$
  Plating time: 1 to 60 seconds Further, a heat resistant and rust proof layer containing at least one or more elements selected from zinc, nickel, copper and phosphorus can be further formed on the roughened layer, and a chromate coating layer and the chromate coating layer can be formed on the heat resistant and rust proof layer, and a layer of a silane coupling agent can be formed on the chromate coating layer to obtain a copper foil for a printed wiring board.

For a heat resistant and rust proof layer, any conventional heat resistant and rust proof layers can be used without any particular limitation. For example, a conventional brass coating layer can be used for a copper foil for a semiconductor package board.

Further, a chromate coating layer and a layer of a silane coupling agent are formed over this heat resistant and rust proof layer to form an adhesive surface of the copper foil to at least a resin. The copper foil having coating layers comprising the chromate coating layer and the layer of a silane coupling agent is laminate-bonded to a resin, and an etching resistant printed circuit is further formed on this copper foil, and then an unwanted region of the copper foil except for a region of the printed circuit is removed by etching to form a conductive circuit.

For a heat resistant and rust proof layer, existing treatments can be used. Specifically, the followings can be used as an example:
(Liquid Composition)
  NaOH: 40 to 200 g/L
  NaCN: 70 to 250 g/L
  CuCN: 50 to 200 g/L
  $Zn(CN)_2$: 2 to 100 g/L
  $As_2O_3$: 0.01 to 1 g/L
(Solution Temperature)
  40 to 90° C.
(Electric Current Condition)
  Current density: 1 to 50 A/dm$^2$
  Plating time: 1 to 20 seconds For the chromate coating layer, an electrolytic chromate coating layer or an immersion chromate coating layer can be used. Preferably, this chromate coating layer has Cr in an amount of 25 to 150 μg/dm$^2$.

When the amount of Cr is less than 25 μg/dm$^2$, the rust proof layer is not effective. And, a Cr content of more than 150 μg/dm$^2$ is also useless since the effect will be saturated. Thus, preferably, the amount of Cr is 25 to 150 μg/dm$^2$.

Examples of the conditions for forming the chromate coating layer are described below. However, as described above, any previously known chromate treatments can be used without being limited to the conditions. This rust proof treatment is one of the factors which affect acid resistance, and acid resistance is improved by chromate treatment.
(a) Immersion Chromate Treatment
  $K_2Cr_2O_7$: 1 to 5 g/L, pH: 2.5 to 4.5, temperature: 40 to 60° C., time: 0.5 to 8 seconds
(b) Electrolytic Chromate Treatment (Chromium and Zinc Treatment (an Alkaline Bath))
  $K_2Cr_2O_7$: 0.2 to 20 g/L; acid:phosphoric acid, sulfuric acid, organic acid; pH: 1.0 to 3.5; temperature: 20 to 40° C.; current density: 0.1 to 5 A/dm$^2$; time: 0.5 to 8 seconds
(c) Electrolytic Chromium and Zinc Treatment (an Alkaline Bath)
  $K_2Cr_2O_7$ ($Na_2Cr_2O_7$ or $CrO_3$): 2 to 10 g/L; NaOH or KOH: 10 to 50 g/L; ZnOH or $ZnSO_4 \cdot 7H_2O$: 0.05 to 10 g/L; pH: 7 to 13; bath temperature: 20 to 80° C.; current density: 0.05 to 5 A/dm$^2$; time: 5 to 30 seconds
(d) Electrolytic Chromate Treatment (Chromium and Zinc Treatment (an Acid Bath))
  $K_2Cr_2O_7$: 2 to 10 g/L; Zn: 0 to 0.5 g/L; $Na_2SO_4$: 5 to 20 g/L, pH: 3.5 to 5.0; bath temperature: 20 to 40° C.; current density: 0.1 to 3.0 A/dm$^2$; time: 1 to 30 seconds For a layer of a silane coupling agent used for the copper foil for a semiconductor package board of the present invention, any silane coupling agents usually used for a copper foil can be used without any particular limitation. For example, specific conditions for silane treatment are as follows:
  0.2% epoxy silane/0.4% TEOS, PH5

A mixture containing tetra alkoxysilane and one or more alkoxysilanes having a functional group reactive with a resin can also be used. Any silane coupling agents can be selected, but preferably they are selected in view of adhesiveness with a resin.

EXAMPLES

Examples and Comparative Examples are now explained. Note that examples are intended only to illustrate preferred examples, and the present invention is not limited to these examples. Therefore, any modifications, other embodiments or aspects within the spirit of the present invention are all encompassed by the present invention. Comparative Examples are provided for a companion with the present invention.

Example 1

Using a 12 μm-thick electrolytic copper foil (the roughness of a surface on which a roughened copper layer is formed: Rz 0.6 μm), roughening plating was performed on the rough surface (namely 'matte surface' or 'M surface') of this copper foil as described below. The treatment conditions are shown below. Each of these is a step for forming a roughened layer on the copper foil of the present invention. The ratio to the limiting current density when forming roughening particles was 2.50.
(Liquid Composition 1)
  $CuSO_4.5H_2O$: 58.9 g/L
  Cu: 15 g/L
  $H_2SO_4$: 100 g/L
  $Na_2WO_4.2H_2O$: 5.4 mg/L
  W: 3 mg/L
  Added amount of sodium dodecyl sulfate: 10 ppm
  (Electroplating Temperature 1) 50° C.
Normal plating as shown below was performed after the present roughening treatment. The treatment conditions are shown below.
(Liquid Composition 2)
  $CuSO_4{}'5H_2O$: 156 g/L
  Cu: 40 g/L
  $H_2SO_4$: 100 g/L
  (Electroplating Temperature 1) 40° C.
(Electric Current Condition 1)
  Current density: 30 A/dm$^2$
  The amount of coulomb for roughening: 150 As/dm$^2$
Next, electrolytic chromate treatment was performed on the heat resistant rust proof layer.
Electrolytic Chromate Treatment (Chromium and Zinc Treatment (an Acid Bath))
  $CrO_3$: 1.5 g/L
  $ZnSO_4.7H_2O$: 2.0 g/L
  $Na_2SO_4$: 18 g/L
  pH: 4.6, bath temperature: 37° C.
  Current density: 2.0 A/dm$^2$
  Time: 1 to 30 seconds
  (PH adjustment was performed with sulfuric acid or potassium hydroxide)
Silane treatment of coating was performed on the chromate coating layer.

The condition for silane treatment is as follows:
0.2% epoxy silane

Figure 2:
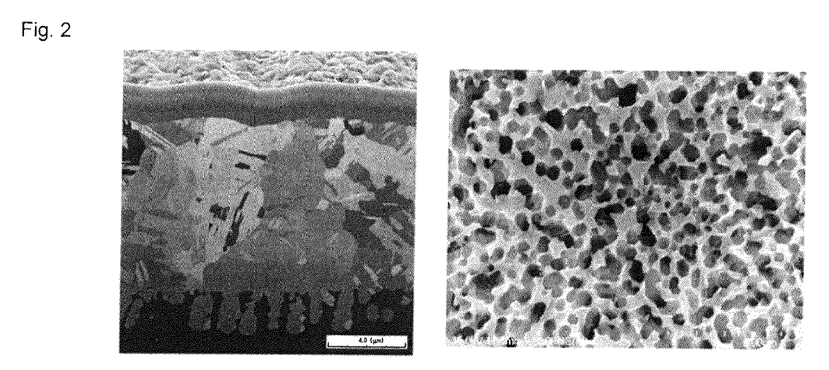
FIG. 2 shows a FIB-SIM photograph (left) of the roughened layer of Example 1, and a SEM photograph (right) of the surface of a resin (replica) in which a resin was laminated on a copper layer and then the copper layer was removed by etching.

A FIB-SIM photograph of the roughened layer of Example 1 is shown in the left of FIG. 2. The surface roughness Rz of this roughened layer is 1.17 μm, and the average diameter at the particle root (D1) corresponding to a distance of 10% of the particle length is 0.57 μm, the particle length (L1) is 2.68, and the ratio to the average diameter at the particle root (D1) is 4.74 when L1/D1. As seen in FIG. 2, needle-like or rod-like particles appear to be formed. Note that the diameter of a roughening particle is measured based on the method of cutting according to Section 7 in JIS H0501.

The roughened layer of the copper foil satisfied the conditions of the present invention where the average diameter at the particle root (D1) corresponding to a distance of 10% of the particle length of the present invention is 0.2 μm to 1.0 μm, and the ratio of the particle length (L1) to the average diameter (D1) of the particle root is 15 or less when L1/D1. These conditions are essential requirements to achieve the present invention. The results are shown in Table 1.

In addition to the average diameter (width) at the root of roughening particles D1: 0.57, the followings are shown in Table 1: the average diameter at the middle D2: 0.83, the average diameter at the tip D3: 0.68, the ratio of the average diameter at the middle to the average diameter at the root: D2/D1=1.47, the ratio of the average diameter at the tip to the average diameter at the root D3/D1=1.21, and the ratio of the average diameter at the tip to the average diameter at the middle: D3/D2=0.83. All of these satisfied the preferred requirements of the present invention.

However, it should be easily understood that these are not primary requirements, i.e. not essential requirements for the present invention. These merely illustrate more preferred conditions.

Next, using this copper foil and using MBT-830 as a resin, the resin was laminated on the copper foil. A SEM photograph of the surface of the resin (replica) from which the copper layer laminated on the resin was removed by etching is shown in the right of FIG. 2. A sum of area covered by holes on an uneven surface to which the roughened surface of the copper foil is transferred is 51%, and the density of the holes is 2.10 per μm$^2$, which satisfy the condition where a sum of area covered by holes of the present invention is 20% or more.

The normal peel strength and the peel strength after heating are measured for a layered product in which a resin (MBT-830) is laminated on a copper foil as described above. The results are also shown in Table 1. The circuit width for peel strength is 10 mm. The normal peel strength was 1.01 kg/cm and the peel strength after heating was 0.94 kg/cm, which showed an improvement in peel strength compared to Comparative Examples described below.

TABLE 1

| | ratio to the limiting current density when forming roughening particles | Peel Strength Normal State (kg/cm) | Peel Strength After heating (kg/cm) | Roughness (μm) | Roughening Particle Root Width D1 | Middle D2 | Tip D3 | D2/D1 | D3/D1 | D3/D2 | Length | Ratio (Length/Width) | Replica Density (holes/μm$^2$) | percentage of Area (%) |
|---|---|---|---|---|---|---|---|---|---|---|---|---|---|---|
| Comparative Example 1 | 10.50 | 0.54 | 0.53 | 1.13 | 0.12 | 0.74 | 0.74 | 5.93 | 5.93 | 1.00 | 3.87 | 30.97 | 1.06 | 2% |
| Comparative Example 2 | 9.50 | 0.58 | 0.49 | 1.02 | 0.15 | 0.65 | 0.65 | 4.25 | 4.25 | 1.00 | 2.83 | 18.54 | 2.11 | 4% |
| Comparative Example 3 | 9.80 | 0.73 | 0.69 | 0.88 | 0.14 | 0.65 | 0.65 | 4.50 | 4.50 | 1.00 | 2.98 | 20.64 | 3.12 | 14% |
| Example 1 | 2.50 | 1.01 | 0.94 | 1.17 | 0.57 | 0.83 | 0.68 | 1.47 | 1.21 | 0.83 | 2.68 | 4.74 | 2.10 | 51% |
| Example 2 | 3.10 | 0.81 | 0.78 | 1.51 | 0.51 | 0.78 | 0.68 | 1.51 | 1.32 | 0.87 | 2.68 | 5.21 | 1.93 | 29% |

TABLE 1-continued

| | ratio to the limiting current density when forming roughening particles | Peel Strength Normal State (kg/cm) | Peel Strength After heating (kg/cm) | Roughness (μm) | Root Width D1 | Middle D2 | Tip D3 | D2/D1 | D3/D1 | D3/D2 | Length | Ratio (Length/Width) | Density (holes/μm²) | Replica percentage of Area (%) |
|---|---|---|---|---|---|---|---|---|---|---|---|---|---|---|
| Example 3 | 4.30 | 0.84 | 0.77 | 1.56 | 0.59 | 0.73 | 0.65 | 1.23 | 1.10 | 0.89 | 2.68 | 4.52 | 1.77 | 43% |
| Example 4 | 3.50 | 0.90 | 0.86 | 1.62 | 0.89 | 1.05 | 0.98 | 1.18 | 1.10 | 0.93 | 2.98 | 3.33 | 2.02 | 78% |
| Example 5 | 4.80 | 0.91 | 0.84 | 1.01 | 0.26 | 0.84 | 0.79 | 3.23 | 3.06 | 0.95 | 2.68 | 10.34 | 2.65 | 40% |
| Example 6 | 3.20 | 0.91 | 0.91 | 1.48 | 0.60 | 0.84 | 0.78 | 1.39 | 1.30 | 0.94 | 2.68 | 4.44 | 2.22 | 93% |

Resin: MBT-830
Circuit width for the peel strength measurement: 10 mm
Method of measuring root width of roughening particle: JIS H 0501 Section 7, cutting method

Example 2

Using a 12-μm thick electrolytic copper foil, roughening plating as described below and normal plating as in Example 1 were performed on a rough surface (a matte surface) of that copper foil. The treatment conditions for roughening plating are shown below. Each of these is a step for forming a roughened layer on the copper foil of the present invention. The ratio to the limiting current density when forming roughening particles was 3.10.
(Liquid Composition 1)
  $CuSO_4 \cdot 5H_2O$: 58.9 g/L
  Cu: 15 g/L
  $H_2SO_4$: 100 g/L
  $Na_2WO_4 \cdot 2H_2O$: 5.4 mg/L
  W: 3 mg/L
  Added amount of sodium dodecyl sulfate: 10 ppm
  (Electroplating Temperature 1) 50° C.

The surface roughness Rz of this roughened layer is 1.51 μm, and the average diameter at the particle root (D1) is 0.51 μm, and the particle length (L1) is 2.68 μm, and the ratio to the average diameter at the particle root (D1) is 5.21 when L1/D1. Needle-like or rod-like particles appear to be formed by the look of FIG. 2. Note that the diameter of a roughening particle is measured based on the method of cutting according to Section 7 in JIS H0501.

The roughened layer of the copper foil satisfied the conditions of the present invention where the average diameter at the particle root (D1) corresponding to a distance of 10% of the particle length of the present invention is 0.2 μm to 1.0 μm, and the ratio of the particle length (L1) to the average diameter (D1) of the particle root is 15 or less when L1/D1. These conditions are essential requirements to achieve the present invention. The results are shown in Table 1.

In addition to the average diameter (width) at the root of roughening particles D1: 0.51 μm, the followings are shown in Table 1: the average diameter at the middle D2: 0.78 μm, the average diameter at the tip D3: 0.68 μm, the ratio of the average diameter at the middle to the average diameter at the root: D2/D1=1.51, the ratio of the average diameter at the tip to the average diameter at the root D3/D1=1.32, and the ratio of the average diameter at the tip to the average diameter at the middle: D3/D2=0.87. All of these satisfied the preferred requirements of the present invention.

However, it should be easily understood that these are not primary requirements, i.e. not essential requirements for the present invention. These merely illustrate more preferred conditions.

Next, using this copper foil and using MBT-830 as a resin, the resin was laminated on the copper foil, and then the copper layer was removed by etching. A sum of area covered by holes on an uneven surface of the resin to which the roughened surface of the copper foil is transferred is 29%, and the density of the holes is 1.93 per μm², which satisfy the condition where a sum of area covered by holes of the present invention is 20% or more.

The normal peel strength and the peel strength after heating are measured for a layered product in which a resin (MBT-830) is laminated on a copper foil as described above. The results are also shown in Table 1. The circuit width for peel strength is 10 mm. The normal peel strength was 0.81 kg/cm and the peel strength after heating was 0.78 kg/cm, which showed an improvement in peel strength compared to Comparative Examples described below.

Example 3

Using a 12-μm thick electrolytic copper foil, roughening plating as described below and normal plating as in Example 1 were performed on a rough surface (a matte surface) of that copper foil. The treatment conditions for roughening plating are shown below. Each of these is a step for forming a roughened layer on the copper foil of the present invention. The ratio to the limiting current density when forming roughening particles was 4.30.
(Liquid Composition 1)
  $CuSO_4 \cdot 5H_2O$: 58.9 g/L
  Cu: 15 g/L
  $H_2SO_4$: 100 g/L
  $Na_2WO_4 \cdot 2H_2O$: 5.4 mg/L
  W: 3 mg/L
  Added amount of sodium dodecyl sulfate: 10 ppm
  (Electroplating Temperature 1) 50° C.

The surface roughness Rz of this roughened layer is 1.56 μm, and the average diameter at the particle root (D1) corresponding to a distance of 10% of a particle length is 0.59 μm. The particle length (L1) is 2.68 μm, and the ratio to the average diameter at the particle root (D1) is 4.52 when L1/D1. By the look of FIG. 2, needle-like or rod-like particles appear to be formed. Note that the diameter of a roughening particle is measured based on the method of cutting according to Section 7 in JIS H0501.

The roughened layer of the copper foil satisfied the conditions of the present invention where the average diameter at the particle root (D1) corresponding to a distance of 10% of the particle length of the present invention is 0.2 μm to 1.0 μm, and the ratios of the particle length (L1) and the average diameter at the particle root (D1) is 15 or less when L1/D1. These conditions are essential requirements to achieve the present invention. The results are shown in Table 1.

In addition to the average diameter (width) at the root of roughening particles D1: 0.51 μm, the followings are shown in Table 1: the average diameter at the middle D2: 0.73 μm, the average diameter at the tip D3: 0.65 μm, the ratio of the average diameter at the middle to the average diameter at the root: D2/D1=1.23, the ratio of the average diameter at the tip to the average diameter at the root D3/D1=1.10, and the ratio of the average diameter at the tip to the average diameter at the middle: D3/D2=0.89. All of these satisfied the preferred requirements of the present invention. However, it should be easily understood that these are not primary requirements, i.e. not essential requirements for the present invention. These merely illustrate more preferred conditions.

Next, using this copper foil and using MBT-830 as a resin, the resin was laminated on the copper foil, and then the copper layer was removed by etching. A sum of area covered by holes on an uneven surface of the resin to which the roughened surface of the copper foil is transferred is 43%, and the density of the holes is 1.77 per μm², which satisfy the condition where a sum of area covered by holes of the present invention is 20% or more.

The normal peel strength and the peel strength after heating are measured for a layered product in which a resin (MBT-830) is laminated on a copper foil as described above. The results are also shown in Table 1. The circuit width for peel strength is 10 mm. The normal peel strength was 0.84 kg/cm and the peel strength after heating was 0.77 kg/cm, which showed an improvement in peel strength compared to Comparative Examples described below.

Example 4

Using a 12-μm thick electrolytic copper foil, roughening plating as described below and normal plating as in Example 1 were performed on a rough surface (a matte surface) of that copper foil. The treatment conditions for roughening plating are shown below. Each of these is a step for forming a roughened layer on the copper foil of the present invention. The ratio to the limiting current density when forming roughening particles was 3.50.
(Liquid Composition 1)
  CuSO₄.5H₂O: 58.9 g/L
  Cu: 15 g/L
  H₂SO₄: 100 g/L
  Na₂WO₄.2H₂O: 5.4 mg/L
  W: 3 mg/L
  Added amount of sodium dodecyl sulfate: 10 ppm
  (Electroplating Temperature 1) 50° C.

The surface roughness Rz of this roughened layer is 1.62 μm, and the average diameter at the particle root (D1) corresponding to a distance of 10% of a particle length is 0.89 μm. The particle length (L1) is 2.98 μm, and the ratio to the average diameter at the particle root (D1) is 3.33 when L1/D1. By the look of FIG. 2, needle-like or rod-like particles appear to be formed. Note that the diameter of a roughening particle is measured based on the method of cutting according to Section 7 in JIS H0501.

The roughened layer of the copper foil satisfied the conditions of the present invention where the average diameter at the particle root (D1) corresponding to a distance of 10% of the particle length of the present invention is 0.2 μm to 1.0 μm, and the ratio of the particle length (L1) to the average diameter (D1) of the particle root is 15 or less when L1/D1. These conditions are essential requirements to achieve the present invention. The results are shown in Table 1.

In addition to the average diameter (width) at the root of roughening particles D1: 0.89, the followings are shown in Table 1: the average diameter at the middle D2: 1.65 μm, the average diameter at the tip D3: 0.98 μm, the ratio of the average diameter at the middle to the average diameter at the root: D2/D1=1.18, the ratio of the average diameter at the tip to the average diameter at the root D3/D1=1.10, and the ratio of the average diameter at the tip and the average diameter at the middle: D3/D2=0.93. All of these satisfied the preferred requirements of the present invention.

However, it should be easily understood that these are not primary requirements, i.e. not essential requirements for the present invention. These merely illustrate more preferred conditions.

Next, using this copper foil and using MBT-830 as a resin, the resin was laminated on the copper foil, and then the copper layer was removed by etching.

A sum of area covered by holes on an uneven surface of the resin to which the roughened surface of the copper foil is transferred is 78%, and the density of the holes is 2.02 per μm², which satisfy the condition where a sum of area covered by holes of the present invention is 20% or more.

The normal peel strength and the peel strength after heating are measured for a layered product in which a resin (MBT-830) is laminated on a copper foil as described above. The results are also shown in Table 1. The circuit width for peel strength is 10 mm. The normal peel strength was 0.90 kg/cm and the peel strength after heating was 0.86 kg/cm, which showed an improvement in peel strength compared to Comparative Examples described below.

Example 5

Using a 12-μm thick electrolytic copper foil, roughening plating as described below and normal plating as in Example 1 were performed on a rough surface (a matte surface) of that copper foil. The treatment conditions for roughening plating are shown below. Each of these is a step for forming a roughened layer on the copper foil of the present invention. The ratio to the limiting current density when forming roughening particles was 4.80.
(Liquid Composition 1)
  CuSO₄.5H₂O: 58.9 g/L
  Cu: 15 g/L
  H₂SO₄: 100 g/L
  Na₂WO₄.2H₂O: 5.4 mg/L
  W: 3 mg/L
  Added amount of sodium dodecyl sulfate: 10 ppm
  (Electroplating Temperature 1) 50° C.

The surface roughness Rz of this roughened layer is 1.01 μm, and the average diameter at the particle root (D1) corresponding to a distance of 10% of the particle length is 0.26 μm. The particle length (L1) is 2.68 μm, and the ratio to the average diameter at the particle root (D1) is 10.34 when L1/D1. By the look of FIG. 2, needle-like or rod-like particles appear to be formed. Note that the diameter of a roughening particle is measured based on the method of cutting according to Section 7 in JIS H0501.

The roughened layer of the copper foil satisfied the conditions of the present invention where the average diameter at the particle root (D1) corresponding to a distance of 10% of the particle length of the present invention is 0.2 μm to 1.0 μm. The ratio of the particle length (L1) to the average diameter (D1) of the particle root is 15 or less when L1/D1. These conditions are essential requirements to achieve the present invention. The results are shown in Table 1.

In addition to the average diameter (width) at the root of roughening particles D1: 0.26 μm, the followings are shown in Table 1: the average diameter at the middle D2: 0.84 μm, the average diameter at the tip D3: 0.79 μm, the ratio of the average diameter at the middle to the average diameter at the root: D2/D1=3.23, the ratio of the average diameter at the tip to the average diameter at the root D3/D1=3.06, and the ratio of the average diameter at the tip to the average diameter at the middle: D3/D2=0.95. All of these satisfied the preferred requirements of the present invention. However, it should be easily understood that these are not primary requirements, i.e.

not essential requirements for the present invention. These merely illustrate more preferred conditions.

Next, using this copper foil and using MBT-830 as a resin, the resin was laminated on the copper foil. A sum of area covered by holes on an uneven surface of the resin to which the roughened surface of the copper foil is transferred is 40%, and the density of the holes is 2.65 per $\mu m^2$, which satisfy the condition where a sum of area covered by holes of the present invention is 20% or more.

The normal peel strength and the peel strength after heating are measured for a layered product in which a resin (MBT-830) is laminated on a copper foil as described above. The results are also shown in Table 1. The circuit width for peel strength is 10 mm. The normal peel strength was 0.91 kg/cm and the peel strength after heating was 0.84 kg/cm, which showed an improvement in peel strength compared to Comparative Examples described below.

Example 6

Using a 12-μm thick electrolytic copper foil, roughening plating as described below and normal plating as in Example 1 were performed on a rough surface (a matte surface) of that copper foil. The treatment conditions for roughening plating are shown below. Each of these is a step for forming a roughened layer on the copper foil of the present invention. The ratio to the limiting current density when forming roughening particles was 3.20.
(Liquid Composition 1)
  $CuSO_4.5H_2O$: 58.9 g/L
  Cu: 15 g/L
  $H_2SO_4$: 100 g/L
  $Na_2WO_4.2H_2O$: 5.4 mg/L
  W: 3 mg/L
  Added amount of sodium dodecyl sulfate: 10 ppm
  (Electroplating Temperature 1) 50° C.
The surface roughness Rz of this roughened layer is 1.48 μm, and the average diameter at the particle root (D1) corresponding to a distance of 10% of the particle length is 0.60 μm. The particle length (L1) is 2.68 μm, and the ratio to the average diameter at the particle root (D1) is 4.44 when L1/D1. By the look of FIG. 2, needle-like or rod-like particles appear to be formed. Note that the diameter of a roughening particle is measured based on the method of cutting according to Section 7 in JIS H0501.

The roughened layer of the copper foil satisfied the conditions of the present invention where the average diameter at the particle root (D1) corresponding to a distance of 10% of the particle length of the present invention is 0.2 μm to 1.0 μm, and the ratio of the particle length (L1) to the average diameter (D1) of the particle root is 15 or less when L1/D1. These conditions are essential requirements to achieve the present invention. The results are shown in Table 1.

In addition to the average diameter (width) at the root of roughening particles D1: 0.60 μm, the followings are shown in Table 1: the average diameter at the middle D2: 0.84 μm, the average diameter at the tip D3: 0.78 μm, the ratio of the average diameter at the middle to the average diameter at the root: D2/D1=1.39, the ratio of the average diameter at the tip to the average diameter at the root D3/D1=1.30, and the ratio of the average diameter at the tip to the average diameter at the middle: D3/D2=0.94. All of these satisfied the preferred requirements of the present invention.

However, it should be easily understood that these are not primary requirements, i.e. not essential requirements for the present invention. These merely illustrate more preferred conditions.

Next, using this copper foil and using MBT-830 as a resin, the resin was laminated on the copper foil, and then the copper layer was removed by etching.

A sum of area covered by holes on an uneven roughened surface of the resin to which the roughened surface of the copper foil is transferred is 93%, and the density of the holes is 2.22 per $\mu m^2$, which satisfy the condition where a sum of area covered by holes of the present invention is 20% or more.

The normal peel strength and the peel strength after heating are measured for a layered product in which a resin (MBT-830) is laminated on a copper foil as described above, as the results shown in Table 1. The circuit width for peel strength is 10 mm. The normal peel strength was 0.91 kg/cm and the peel strength after heating was 0.91 kg/cm, which showed an improvement in peel strength compared to Comparative Examples described below.

Comparative Example 1

Figure 3:
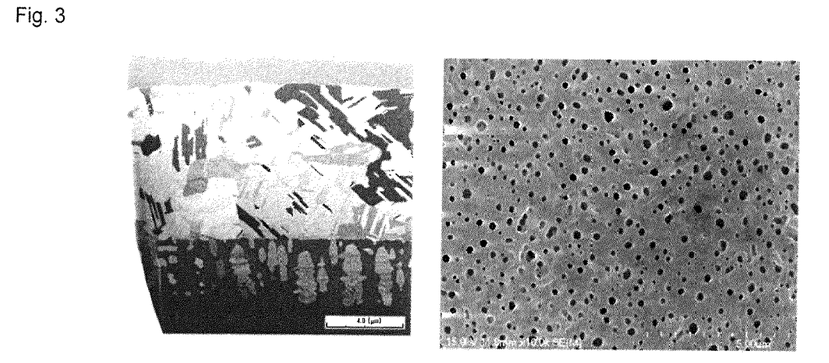
FIG. 3 shows a FIB-SIM photograph of the roughened layer of Comparative Example 1, and a SEM photograph (right) of the surface of a resin (replica) in which a resin was laminated on a copper layer and then the copper layer was removed by etching.

Using a 12-μm thick electrolytic copper foil, roughening plating as described below and normal plating as in Example 1 were performed on a rough surface (a matte surface) of that copper foil. The treatment conditions for roughening plating are shown below. The ratio to the limiting current density when forming roughening particles was 10.50.
(Liquid Composition 1)
  $CuSO_4.5H_2O$: 58.9 g/L
  Cu: 15 g/L
  $H_2SO_4$: 100 g/L
  $Na_2WO_4.2H_2O$: 5.4 mg/L
  W: 3 mg/L
  Added amount of sodium dodecyl sulfate: 10 ppm
  (Electroplating Temperature 1) 50° C.
A SEM photograph of the roughened layer of Comparative Example 1 is shown in the left of FIG. 3. The surface roughness Rz of this roughened layer is 1.13 μm, and the average diameter at the particle root (D1) corresponding to a distance of 10% of a particle length is 0.12 μm, which shows a narrow width at the root. The particle length (L1) is 3.87 μm, and the ratio to the average diameter at the particle root (D1) is 30.97 when L1/D1. By the look of FIG. 3, needle-like or dendrite-like particles incompatible with the present invention appear to be formed. Note that the diameter of a roughening particle is measured based on the method of cutting according to Section 7 in JIS H0501.

As shown above, the roughened layer of the copper foil did not satisfy the conditions of the present invention where the average diameter at the particle root (D1) corresponding to a distance of 10% of the particle length of the present invention is 0.2 μm to 1.0 μm, and the ratio of the particle length (L1) to the average diameter (D1) of the particle root is 15 or less when L1/D1, as shown in Table 1.

In addition to the average diameter (width) at the root of roughening particles D1: 0.12 μm, the followings are shown in Table 1: the average diameter at the middle D2: 0.74 μm, the average diameter at the tip D3: 0.74 μm, the ratio of the average diameter at the middle to the average diameter at the root: D2/D1=5.93, the ratio of the average diameter at the tip to the average diameter at the root D3/D1=5.93, and the ratio of the average diameter at the tip to the average diameter at the middle: D3/D2=1.00, which did not satisfy the preferred requirements of the present invention.

Next, using this copper foil and using MBT-830 as a resin, the resin was laminated on the copper foil, and then the copper layer was removed by etching.

A sum of area covered by holes on an uneven surface of the resin to which the roughened surface of the copper foil is transferred is 2%, and the density of the holes is 1.06 per $\mu m^2$, which do not satisfy the condition where a sum of area covered by holes of the present invention is 20% or more.

The normal peel strength and the peel strength after heating are measured for a layered product in which a resin (MBT-830) is laminated on a copper foil as described above. The results are also shown in Table 1. The circuit width for peel strength is 10 mm. The normal peel strength was 0.54 kg/cm and the peel strength after heating was 0.53 kg/cm, which showed a significant deterioration in peel strength compared to Examples noted above. In the case of using the copper foil having fine roughening particles with a narrow root as described, improvement in peel strength was unable to be anticipated because detachment will occur at the interface between the copper layer and the roughening particles when peeling the copper foil from the resin.

Comparative Example 2

Using a 12-μm thick electrolytic copper foil, roughening plating as described below and normal plating as in Example 1 were performed on a rough surface (a matte surface) of that copper foil. The treatment conditions for roughening plating are shown below. The ratio to the limiting current density when forming roughening particles was 9.50.
(Liquid Composition 1)
  $CuSO_4.5H_2O$: 58.9 g/L
  Cu: 15 g/L
  $H_2SO_4$: 100 g/L
  $Na_2WO_4 2H_2O$: 5.4 mg/L
  W: 3 mg/L
  Added amount of sodium dodecyl sulfate: 10 ppm
  (Electroplating Temperature 1) 50° C.

The surface roughness Rz of the roughened layer of Comparative Example 2 is 1.02 μm, and the average diameter at the particle root (D1) corresponding to a distance of 10% of the particle length is 0.15 μm, which shows a narrow width at the root. The particle length (L1) is 2.83 μm, and the ratio to the average diameter at the particle root (D1) is 18.54 when L1/D1. By the look of FIG. 3, needle-like or dendrite-like particles incompatible with the present invention appear to be formed. Note that the diameter of a roughening particle is measured based on the method of cutting according to Section 7 in JIS H0501.

As described above, the roughened layer of the copper foil did not satisfy the conditions of the present invention where the average diameter at the particle root (D1) corresponding to a distance of 10% of the particle length of the present invention is 0.2 μm to 1.0 μm. The ratio of the particle length (L1) to the average diameter (D1) of the particle root is 15 or less when L1/D1, as shown in Table 1.

In addition to the average diameter (width) at the root of roughening particles D1: 0.15 μm, the followings are shown in Table 1: the average diameter at the middle D2: 0.65 μm, the average diameter at the tip D3: 0.65 μm, the ratio of the average diameter at the middle to the average diameter at the root: D2/D1=4.25, the ratio of the average diameter at the tip to the average diameter at the root D3/D1=4.25, and the ratio of the average diameter at the tip and the average diameter at the middle: D3/D2=1.00. All of these did not satisfy the preferred requirements of the present invention.

Next, using this copper foil and using MBT-830 as a resin, the resin was laminated on the copper foil, and then the copper layer was removed by etching.

A sum of area covered by holes on an uneven surface of the resin to which the roughened surface of the copper foil is transferred is 4%, and the density of the holes is 2.11 per $μm^2$, which do not satisfy the condition where a sum of area covered by holes of the present invention is 20% or more.

The normal peel strength and the peel strength after heating are measured for a layered product in which a resin (MBT-830) is laminated on a copper foil as described above. The results are also shown in Table 1. The circuit width for peel strength is 10 mm. The normal peel strength was 0.54 kg/cm and the peel strength after heating was 0.53 kg/cm, which showed a significant deterioration in peel strength compared to Examples noted above.

In the case of using a copper foil having fine roughening particles with a narrow root as described, improvement in peel strength was unable to be anticipated because detachment will occur at the interface between the copper layer and the roughening particles when peeling the copper foil from the resin.

Comparative Example 3

Using a 12-μm thick electrolytic copper foil, roughening plating as described below and normal plating as in Example 1 were performed on a rough surface (a matte surface) of that copper foil. The treatment conditions for roughening plating are shown below. The ratio to the limiting current density when forming roughening particles was 9.80.
(Liquid Composition 1)
  $CuSO_4.5H_2O$: 58.9 g/L
  Cu: 15 g/L
  $H_2SO_4$: 100 g/L
  $Na_2WO_4.2H_2O$: 5.4 mg/L
  W: 3 mg/L
  Added amount of sodium dodecyl sulfate: 10 ppm
  (Electroplating Temperature 1) 50° C.

The surface roughness Rz of the roughened layer of Comparative Example 3 is 0.88 μm, and the average diameter at the particle root (D1) corresponding to a distance of 10% of the particle length is 0.14 μm, which shows a narrow width at the root. The particle length (L1) is 2.98 μm, and the ratio to the average diameter at the particle root (D1) is 20.64 when L1/D1. By the look of FIG. 3, needle-like or dendrite-like particles incompatible with the present invention appear to be formed. Note that the diameter of a roughening particle is measured based on the method of cutting according to Section 7 in JIS H0501.

As described above, the roughened layer of the copper foil did not satisfy the conditions of the present invention where the average diameter at the particle root (D1) corresponding to a distance of 10% of the particle length of the present invention is 0.2 μm to 1.0 μm. The ratio of the particle length (L1) to the average diameter (D1) of the particle root is 15 or less when L1/D1, as shown in Table 1.

In addition to the average diameter (width) at the root of roughening particles D1: 0.14 μm, the followings are shown in Table 1: the average diameter at the middle D2: 0.65 μm, the average diameter at the tip D3: 0.65 μm, the ratio of the average diameter at the middle to the average diameter at the root: D2/D1=4.50, the ratio of the average diameter at the tip to the average diameter at the root D3/D1=4.50, and the ratio of the average diameter at the tip to the average diameter at the middle: D3/D2=1.00. All of these did not satisfy the preferred requirements of the present invention.

Next, using this copper foil and using MBT-830 as a resin, the resin was laminated on the copper foil, and then the copper layer was removed by etching. A sum of area covered by holes on an uneven roughened surface of the resin to which the roughened surface of the copper foil is transferred is 14%, and the density of the holes is 3.12 per $μm^2$, which do not satisfy the condition where a sum of area covered by holes of the present invention is 20% or more.

The normal peel strength and the peel strength after heating are measured for a layered product in which a resin (MBT-830) is laminated on a copper foil as described above. The results are also shown in Table 1. The circuit width for peel strength is 10 mm. The normal peel strength was 0.54 kg/cm and the peel strength after heating was 0.53 kg/cm, which showed a significant deterioration in peel strength compared to Examples noted above. In the case of using a copper foil having fine roughening particles with a narrow root as described, improvement in peel strength was unable to be anticipated because detachment will occur at the interface between the copper layer and the roughening particles when peeling the copper foil from the resin.

Thus, the present invention has significantly advantageous effects. Namely the copper foil for a printed wiring board of the present invention can provide a copper foil and a producing method thereof, wherein the adhesiveness with a resin itself can be enhanced, and the peel strength against chemical treatment at the time of forming a fine pattern on a package board can be also increased to allow fine etching by forming a needle-like fine roughening particle on at least one surface of the copper foil, unlike a roundish or spherical projection or a dendrite-like grain size that has been believed to be good in roughening treatment.

INDUSTRIAL APPLICABILITY

As shown above, the present invention has significantly advantageous effects. Namely the present invention can provide a copper foil and a producing method thereof, wherein the adhesiveness with a resin itself can be enhanced, and the peel strength against chemical treatment at the time of forming a fine pattern on a package board can be also increased to allow fine etching by forming a needle-like fine roughening particle on at least one surface of the copper foil.

In the context of an increasingly finer pattern and increasingly higher frequency for a printed circuit in recent years, it is particularly effective for a semiconductor package board fabricated by combining a copper foil for a printed circuit (e.g. a copper foil for a semiconductor package board) and a copper foil for a semiconductor package board with a resin for a semiconductor package.

The invention claimed is:

1. A copper foil for a printed wiring board, said copper foil having a roughened layer comprised of needle or rod-shaped particles, wherein on at least one surface of the copper foil, an average diameter at a needle-like or rod-like particle root (D1) corresponding to a distance of 10% of a needle-like or rod-like particle length is 0.2 μm to 1.0 μm, and a ratio of the particle length (L1) to the average diameter at the particle root (D1) is 15 or less when L1/D1, and a ratio of an average diameter at a needle-like or rod-like particle middle (D2) corresponding to a distance of 50% of the particle length to the average diameter at the particle root (D1) is less than 1.51 when D2/D1.

2. The copper foil for a printed wiring board according to claim 1, wherein the ratio of the average diameter at the particle middle (D2) to a particle tip (D3) corresponding to a distance of 90% of a particle length is 0.8 to 1.0 when D2/D3.

3. The copper foil for a printed wiring board according to claim 2, wherein the average diameter at the particle middle (D2) is 0.7 to 1.5 μm.

4. The copper foil for a printed wiring board according to claim 3, wherein the average diameter at the particle tip (D3) is 0.7 to 1.5 μm.

5. The copper foil for a printed wiring board according to claim 4, comprising a heat resistant and rust proof layer containing at least one or more elements selected from zinc, nickel, copper and phosphorus on the roughened layer, a chromate coating layer on the heat resistant and rust proof layer and a layer of a silane coupling agent on the chromate coating layer.

6. The copper foil for a printed wiring board according to claim 2, wherein the average diameter at the particle tip (D3) is 0.7 to 1.5 μm.

7. The copper foil for a printed wiring board according to claim 1, wherein the copper foil is produced by a method comprising: forming the roughened layer using an electrolytic bath of sulfuric acid and copper sulfate, the electrolytic bath containing at least one or more of the substances selected from sulfuric acid alkyl ester salts, tungsten ions and arsenic ions.

8. The copper foil for a printed wiring board according to claim 7, the method further comprising: forming a heat resistant and rust proof layer containing at least one or more elements selected from zinc, nickel, copper and phosphorus on the roughened layer, then forming a chromate coating layer on the heat resistant and rust proof layer, and further forming a layer of a silane coupling agent on the chromate coating layer.

9. A printed wiring board including the copper foil according to claim 1, wherein on a surface of a resin formed by laminating a resin layer on the copper foil for a printed wiring board and then removing the copper foil by etching, non-electrolytic copper plating and electrolytic plating are performed in this order to form a copper layer, and etching is further performed to form a circuit.

10. The printed wiring board according to claim 9, wherein five or more needle-like particles are present in a circuit width of 10 μm.

11. The copper foil for a printed wiring board according to claim 1, wherein the average diameter at the particle middle (D2) is 0.7 to 1.5 μm.

12. The copper foil for a printed wiring board according to claim 1, comprising a heat resistant and rust proof layer containing at least one or more elements selected from zinc, nickel, copper and phosphorus on the roughened layer, a chromate coating layer on the heat resistant and rust proof layer and a layer of a silane coupling agent on the chromate coating layer.

13. The copper foil for a printed wiring board according to claim 1, wherein the particle length (L1) is at least 2.68 μm.

* * * * *